(12) United States Patent
Kim et al.

(10) Patent No.: US 6,995,389 B2
(45) Date of Patent: Feb. 7, 2006

(54) HETEROSTRUCTURES FOR III-NITRIDE LIGHT EMITTING DEVICES

(75) Inventors: James C. Kim, San Jose, CA (US); Nathan F. Gardner, Mountain View, CA (US); Michael R. Krames, Mountain View, CA (US); Yu-Chen Shen, Sunnyvale, CA (US); Troy A. Trottier, San Jose, CA (US); Jonathan J. Wierer, Jr., Fremont, CA (US)

(73) Assignee: Lumileds Lighting, U.S., LLC, San Jose, CA (US)

( * ) Notice: Subject to any disclaimer, the term of this patent is extended or adjusted under 35 U.S.C. 154(b) by 0 days.

(21) Appl. No.: 10/465,775

(22) Filed: Jun. 18, 2003

(65) Prior Publication Data

US 2004/0256611 A1    Dec. 23, 2004

(51) Int. Cl.
*H01L 29/06* (2006.01)
*H01L 31/0328* (2006.01)
*H01L 31/0336* (2006.01)
*H01L 33/00* (2006.01)

(52) U.S. Cl. .......................... 257/13; 257/14; 257/94; 257/96

(58) Field of Classification Search ............ 257/12–14, 257/79–99
See application file for complete search history.

(56) References Cited

U.S. PATENT DOCUMENTS

| 5,604,762 | A | * | 2/1997 | Morinaga et al. ............. 372/43 |
| 5,825,796 | A |   | 10/1998 | Jewell et al. |
| 6,274,924 | B1 | * | 8/2001 | Carey et al. ................. 257/676 |
| 6,278,134 | B1 |   | 8/2001 | Capasso et al. |
| 6,489,636 | B1 | * | 12/2002 | Goetz et al. .................. 257/94 |
| 2002/0149024 | A1 | * | 10/2002 | Kato et al. ..................... 257/79 |
| 2003/0006418 | A1 | * | 1/2003 | Emerson et al. .............. 257/79 |
| 2004/0056258 | A1 | * | 3/2004 | Tadalomo et al. ............. 257/79 |

OTHER PUBLICATIONS

Y.T. Rebane et al., "Light Emitting Diode with Charge Asymmetric Resonance Tunneling," Physica Status Solidi A Wiley-Vch Germany, vol. 180, No. 1, Jul. 16, 2000, pp. 121-126.

T.C. Wen et al., " InGaN/GaN Tunnel-Injection Blue Light-Emitting Diodes," IEEE Transactions on Electron Devices, vol. 49, No. 6, Jun. 2002, pp. 1093-1095.

P. Bhattacharya et al., "Tunneling Injection Lasers: A New Class of Lasers with Reduced Hot Carrier Effects," IEEE Journal of Quantum Electronics, Vo. 32, No. 9, Sep. 1996, pp. 1620-1629.

(Continued)

*Primary Examiner*—Shouxiang Hu
(74) *Attorney, Agent, or Firm*—Patent Law Group LLP

(57) ABSTRACT

Heterostructure designs are disclosed that may increase the number of charge carriers available in the quantum well layers of the active region of III-nitride light emitting devices such as light emitting diodes. In a first embodiment, a reservoir layer is included with a barrier layer and quantum well layer in the active region of a light emitting device. In some embodiments, the reservoir layer is thicker than the barrier layer and quantum well layer, and has a greater indium composition than the barrier layer and a smaller indium composition than the quantum well layer. In some embodiments, the reservoir layer is graded. In a second embodiment, the active region of a light emitting device is a superlattice of alternating quantum well layers and barrier layers. In some embodiments, the barrier layers are thin such that charge carriers can tunnel between quantum well layers through a barrier layer.

14 Claims, 8 Drawing Sheets

OTHER PUBLICATIONS

A. Ishida et al., "AlN/GaN Near-Infrared Quantum-Cascade Structures with Resonant-Tunneling Injectors Utilizing Polarization Fields," Japanese Journal of Applied Physics, vol. 41, No. 11B, Part 2, Nov. 15, 2002, pp. L1303-L1305.

R. Q. Yang et al., "Interband Cascade Light Emitting Diodes in the 5-8 $\mu$m Spectrum Region," Applied Physics Letters, American Institute of Physics, vol. 70, No. 15, Apr. 14, 1997, pp. 2013-2015.

J.G. Cody et al., "Application of the Digital Alloy Composition Grading Technique to Strained InGaAs/GaAs/AlGaAs Diode Laser Active Regions," Journal of Vacuum Science and Technology: Part B, American Vacuum Society, vo. 12, No. 2, pp. 1075-1077.

K.D. Maranowski et al., "Far-Infrared Electroluminescence from Parabolic Quantum Well Superlattices Excited by Resonant Tunneling Injection," Journal of Applied Physics, vol. 88, No. 1, Jul. 1, 2000, pp. 172-177.

European Search Report, 5 pages.

* cited by examiner

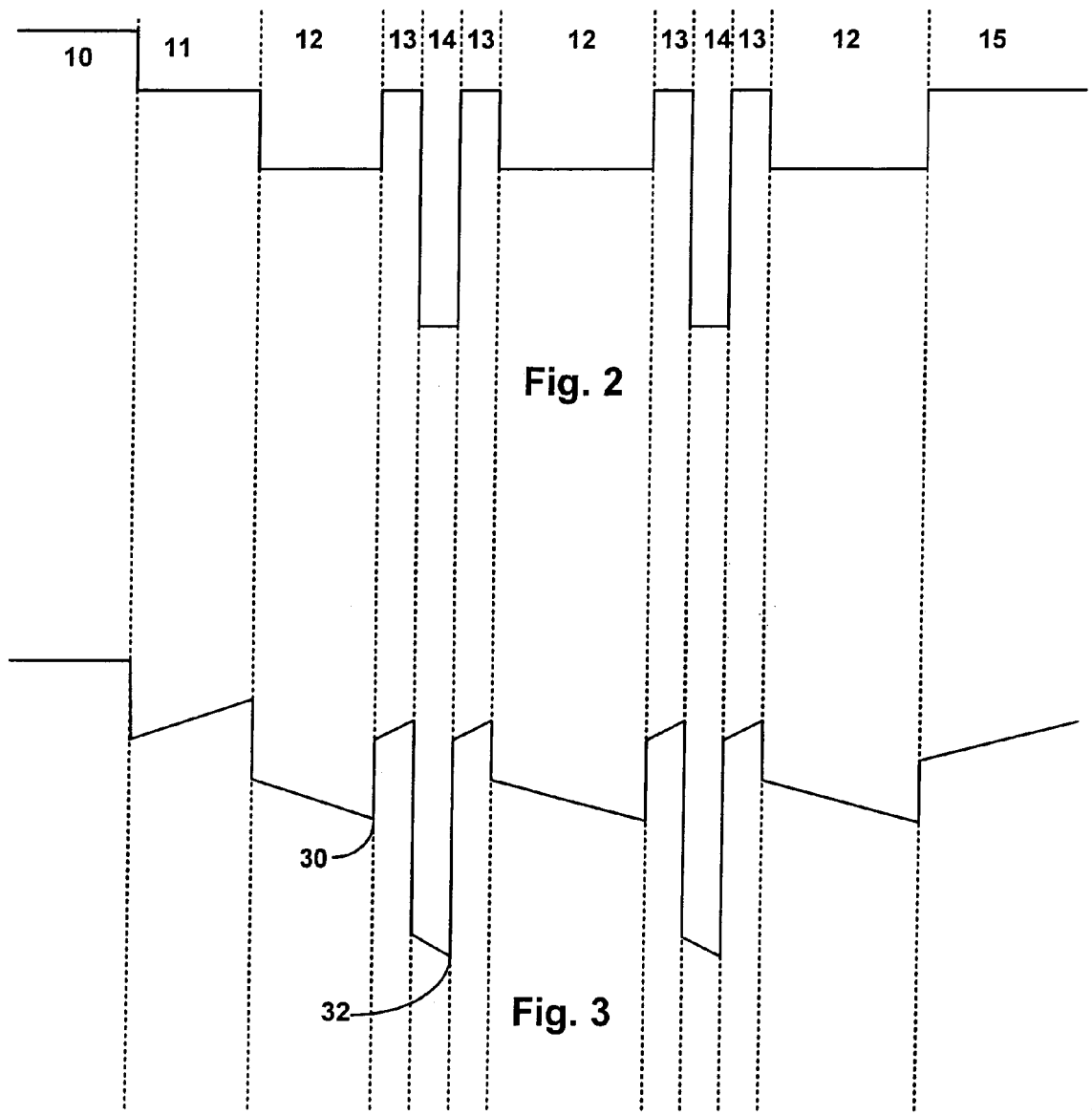

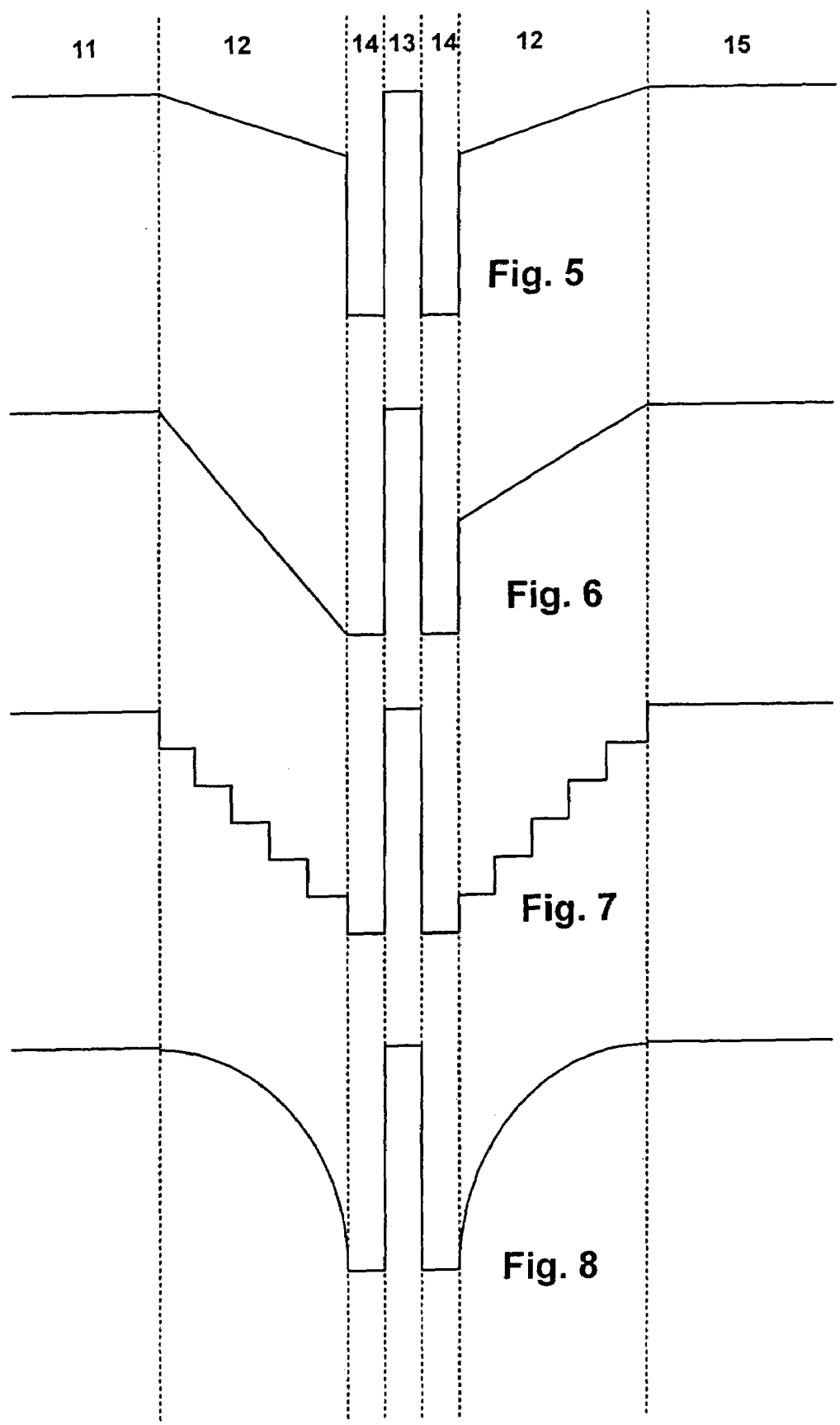

HETEROSTRUCTURES FOR III-NITRIDE LIGHT EMITTING DEVICES

BACKGROUND

1. Field of Invention

This invention relates generally to semiconductor light emitting devices and more particularly to active regions for III-nitride light emitting devices.

2. Description of Related Art

Semiconductor light-emitting devices such as light-emitting diodes (LEDs) are among the most efficient light sources currently available. Materials systems currently of interest in the manufacture of high-brightness LEDs capable of operation across the visible spectrum are Group III-V semiconductors, particularly binary, ternary, and quaternary alloys of gallium, aluminum, indium, and nitrogen, also referred to as III-nitride materials. Typically, III-nitride layers are epitaxially grown on sapphire, silicon carbide, or gallium nitride substrates.

III-nitride devices are usually grown with a light-emitting or active region that includes multiple quantum well layers separated by barrier layers. The active region is sandwiched between a p-type region and an n-type region. The p- and n-type regions supply positive and negative charge carriers (electrons and holes) to the quantum wells in the active region, where the positive and negative charge carriers recombine to generate light. The brightness of a light emitting device is at least partially determined by the internal quantum efficiency of the device, which is an indication of how many light-emitting electron-hole recombinations occur in the active region.

Each quantum well layer can hold a finite number of charge carriers at a given time. The carrier capacity of a semiconductor layer depends on how much material is present in the layer, thus the thicker a quantum well layer, the more carriers that quantum well layer can hold. However, in III-nitride devices, the quantum well layers are typically InGaN, which has a poor crystal quality compared to other III-nitride layers due to the large size of indium atoms and the amount of indium required to make the quantum well layer light emitting. Another complication is that InGaN is usually grown at a lower temperature than GaN, which results in degraded crystal quality. Additionally, there is In fluctuation in the InGaN layers that limits the carrier capacity of the light emitting layers. Piezoelectric fields can cause decreased overlap of electron and hole wavefunctions, with decreased oscillator strength for recombination. Finally, defects in the crystalline semiconductor layers of a device can cause non-radiative recombination of positive and negative charge carriers, which can reduce the amount of light generated by a device by robbing the quantum well layers of charge carriers. Thus, in order to maintain the crystal quality and internal quantum efficiency of the light emitting device, the quantum well layers are generally thin and the barrier layers separating the quantum well layers are generally thick layers of better crystal quality than the In-containing quantum well layers.

SUMMARY

In accordance with embodiments of the invention, heterostructure designs that may increase the number of charge carriers available in the quantum well layers of the active region are disclosed for III-nitride light emitting devices such as light emitting diodes. In a first embodiment, a reservoir layer is included with a barrier layer and quantum well layer in the active region of a light emitting device. In some embodiments, the reservoir layer is thicker than the barrier layer and quantum well layer, has a greater indium composition than the barrier layer, and has a smaller indium composition than the quantum well layer. In some embodiments, the reservoir layer is adjacent to the quantum well layer and is graded to "funnel" carriers into the quantum well layer.

In a second embodiment, the active region of a light emitting device is a superlattice of alternating quantum well layers and barrier layers. In some embodiments, the barrier layers are thin such that charge carriers can tunnel between quantum well layers through a barrier layer.

BRIEF DESCRIPTION OF THE DRAWINGS

FIG. 2 illustrates an example of the conduction band edge energy of the layers of the device illustrated in FIG. 1.

FIG. 3 illustrates an example of the conduction band edge energy of the layers of the device illustrated in FIG. 1, accounting for polarization fields.

FIGS. 5–8 illustrate examples of the conduction band edge energy of the layers of the device illustrated in FIG. 4.

DETAILED DESCRIPTION

In accordance with embodiments of the invention, heterostructure designs that may increase the number of charge carriers available in the quantum well layers of the active region are disclosed for III-nitride light emitting devices such as light emitting diodes. III-nitride semiconductor layers as used herein refers to compounds represented by the general formula $Al_xGa_yIn_{1-x-y}N$ ($0 \leq x \leq 1$, $0 \leq y \leq 1$, $0 \leq x+y \leq 1$), which may further contain group III elements such as boron and thallium and in which some of the nitrogen may be replaced by phosphorus, arsenic, antimony, or bismuth.

Figure 1:
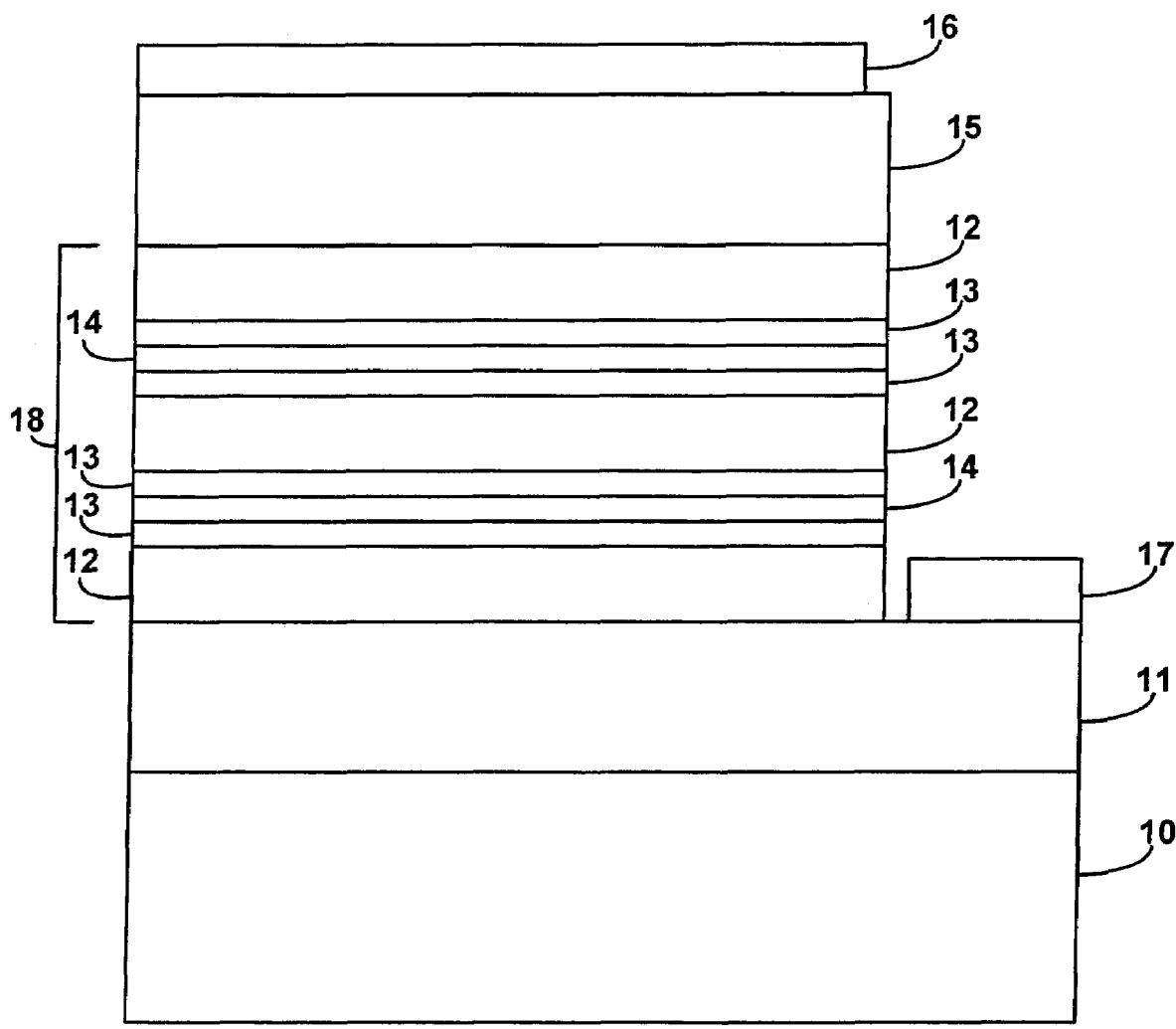
FIG. 1 illustrates a light emitting device according to a first embodiment of the invention.

FIG. 1 illustrates a cross sectional view of a light emitting device according to a first embodiment of the present invention. In the device shown in FIG. 1, one or more n-type layers 11 are deposited epitaxially on a substrate 10. Substrate 10 may be, for example, sapphire, SiC, GaN, or any other suitable substrate. N-type layers 11 may include, for example, a buffer layer, a contact layer, an undoped crystal layer, and n-type layers of varying composition and dopant concentration. An active region 18 is then formed on n-type layers 11. One or more p-type layers 15 are then formed on active region 18. P-type layers 15 may include, for example, a confining layer, a contact layer, and other p-type layers of various composition and dopant concentration. One or more p-metal layers 16 which will form the electrode or contact to p-type layers 15 are then deposited on p-type layers 15. A portion of the active region and p-type layers is removed to expose one of n-type layers 11. One or more n-metal layers 17 are deposited on the exposed portion of n-type layers 11 to make contact to the n-type layers of the device.

Active region 18 contains quantum well layers 14, barrier layers 13, and reservoir layers 12. FIG. 2 illustrates an example of a conduction band edge energy diagram for some of the layers of the device shown in FIG. 1. As illustrated in FIG. 2, reservoir layers 12 have a larger band gap than quantum wells 14, and a smaller band gap than barrier layers 13 and the device layers 11, 15 outside the active region. Quantum well layers 14 and reservoir layers 12 may be InGaN, and barrier layers 13 may be $Al_xGa_yIn_{1-x-y}N$ ($0 \leq x \leq 1$, $0 \leq y \leq 1$, $0 \leq x+y \leq 1$). As the amount of indium in an InGaN layer decreases, the bandgap increases, thus reservoir layers 12 may contain less indium than quantum well layers 14 and more indium than barrier layers 13. Quantum well layers 14 may have an indium composition ranging between 0% (for example, when the barrier layers are AlGaN) and about 30%, and usually have an indium composition ranging between about 4% and about 25%. Barrier layers may have an indium composition ranging between 0% and 15%, and usually have an indium composition ranging between 0% and 5%. Reservoir layers may be GaN, InGaN, or AlInGaN. In one embodiment, the reservoir layers are InGaN with an indium composition ranging between 0% and about 25%.

Barrier layers 13 are thin enough that charge carriers may tunnel from reservoir layers 12 to quantum well layers 14 through barrier layers 13. Barrier layers 13 may have a thickness between about 5 angstroms and about 200 angstroms, and often have a thickness of 20 angstroms or less; quantum well layers 14 may have a thickness between about 5 angstroms and about 100 angstroms and often have a thickness of about 25 angstroms; and reservoir layers may have a thickness between about 5 angstroms and about 500 angstroms, and often have a thickness greater than about 25 angstroms. Reservoir layers 12 and barrier layers 13 may or may not be doped with a p- or n-type dopant. In one embodiment, reservoir layers are doped with an n- or p-type dopant to a dopant concentration between about $5 \times 10^{16}$ $cm^{-3}$ and about $5 \times 10^{19}$ $cm^{-3}$. In one embodiment, reservoir layers 12 are doped with the same conductivity type dopant as the other layers in active region 18.

Reservoir layers 12 provide a store of carriers in close proximity to quantum wells 14 which can readily tunnel into quantum wells 14 through barrier 13. Reservoir layers 12 feed carriers to quantum well layers 14 so that as soon as a carrier leaves a quantum well layer, for example through radiative recombination, another carrier is readily available from reservoir layer 12 to take its place. Since reservoir layers 12 have less indium than quantum well layers 14, reservoir layers 12 have better crystal quality, which allows reservoir layers 12 to hold carriers with a long decay time. The composition and thickness of quantum well layers 14, barrier layers 13, and reservoir layers 12 may be selected such that $$\tau_{RV} \gg \tau_{TUN} \gg \tau_W \quad (1)$$

where $\tau_{RV}$ is the residence time of a carrier in reservoir layer 12, $\tau_{TUN}$ is the time required for a carrier to tunnel from reservoir layer 12 to quantum well layer 14, and $\tau_W$ is the residence time of a carrier in quantum well layer 14 before the carrier recombines to generate light. Because the residence time in reservoir 12 is much longer than the residence time in quantum well layer 14, a constant supply of carriers are available in reservoir 12 to fill any vacancies in quantum well 14.

The probability of tunneling through barriers 13 may be maximized by selecting the composition and thickness of reservoirs 12 and quantum wells 14 such that the energy levels of the states available to charge carriers in reservoirs 12 and quantum wells 14 are nearly equal. When the energy levels of the states are nearly equal, there is a high probability for a carrier to tunnel between a reservoir 12 and a quantum well 14. The tunneling probability may also be maximized by taking advantage of naturally occurring polarization fields in III-nitride materials. FIG. 3 illustrates an example of a conduction band edge energy diagram for some of the layers of the device shown in FIG. 1, taking into account polarization fields present in III-nitride layers. The polarization field distorts the energy band diagram such that the conduction band in reservoir layer 12 at corner 30 is lower than in the rest of reservoir layer 12. Similarly, the conduction band in quantum well layer 14 at corner 32 is lower than in the rest of quantum well layer 14. Since carriers will tend to collect in corner 30 because the conduction band is lower than in the rest of reservoir 12, the carriers are "pushed" toward quantum well 14.

Though FIG. 1 shows a reservoir 12 on either side of each quantum well layer 14, different configurations of reservoirs may be used in the active region. First, two or more quantum well layers may be sandwiched between reservoirs. For example, the active region may be arranged such that a reservoir overlies the n-type layers, a first barrier layer overlies the reservoir, a first quantum well overlies the first barrier, a second barrier overlies the first quantum well, a second quantum well overlies the second barrier, a third barrier overlies the second quantum well, then a second reservoir overlies the third barrier. Second, reservoirs may be used only in the center of the active region. The outermost layers of the active region may be barrier layers or quantum wells, and need not be reservoir layers as in the device shown in FIG. 1. Third, different reservoir layers may have different compositions or thicknesses. The reservoir layers need not be of identical composition and thickness as in the device shown in FIG. 1. Fourth, the placement of reservoir layers in the active region need not be symmetrical. For example, a device may have a reservoir adjacent to the n-type layers on one side of the active region, then a barrier layer or quantum well adjacent to the p-type layers on the other side of the active region.

Figure 4:
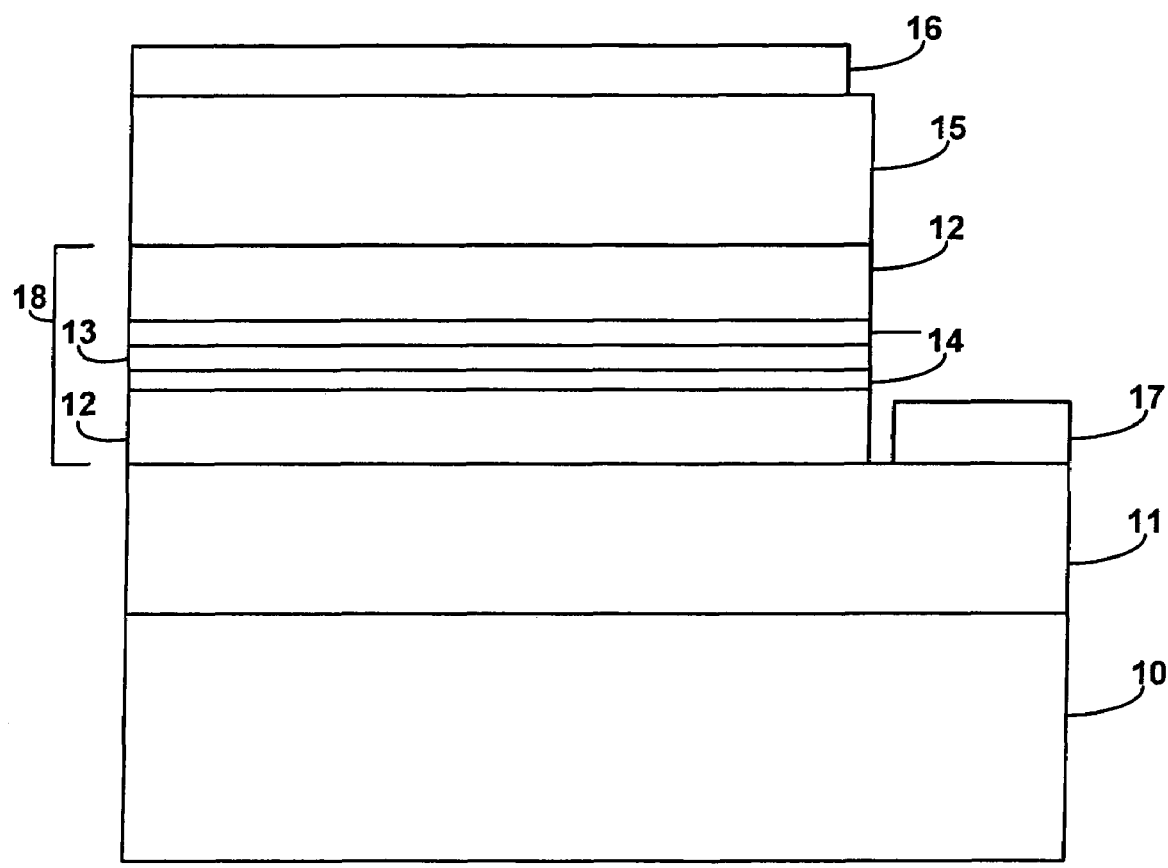
FIG. 4 illustrates a light emitting device according to a second embodiment of the invention.

FIG. 4 illustrates a light emitting device according to a second embodiment of the invention. In the device shown in FIG. 4, quantum well layers 14 are not separated from reservoir layers 12 by barrier layers. Barrier layer 13 may separate quantum well layers 14 from each other as shown in FIG. 4, or another reservoir layer can separate quantum well layers 14.

FIGS. 5–8 illustrate examples of conduction band edge energy diagrams for some of the layers of the device shown in FIG. 4. As shown in FIGS. 5–8, reservoir layers 12 may have a graded composition. As used herein, the term "graded" when describing the composition or dopant concentration in a layer or layers in a device is meant to encompass any structure that achieves a change in composition and/or dopant concentration in any manner other than a single step in composition and/or dopant concentration. In one example, illustrated in FIG. 7, the graded reservoir is a stack of layers, each of the layers having a different composition and/or dopant concentration than either layer adjacent to it. If the layers are of resolvable thickness, the graded region is known as a step-graded or index-graded region. In the limit where the thickness of individual layers approaches zero, the graded reservoir region is known as a continuously-graded region. The layers making up the graded reservoir region can be arranged to form a variety of profiles in composition and/or dopant concentration versus thickness, including, but not limited to, linear grades, parabolic grades, and power-law grades. Also, graded reservoir regions are not limited to a single grading profile, but may include portions with different grading profiles and one or more portions with substantially constant composition and/or dopant concentration regions As illustrated in FIGS. 5 and 6, reservoir layers 12 may be fabricated with linear monotonic compositional grading. In the device shown in FIG. 5, the composition of indium in reservoir 12 is graded from the percentage of indium in n-type layers 1 1, typically zero, to an indium composition less than the indium composition in quantum well layers 14. The indium composition then increases in quantum well layer 14. As illustrated in the device shown in FIG. 6, the indium composition in reservoir layer 12 may be continuously graded from the indium composition in n-type layers 11 to the indium composition in quantum well 14, without an abrupt step change in indium composition between the graded reservoir region 12 and quantum well layer 14. Also, FIG. 6 demonstrates that the grading in the reservoir adjacent to n-type layers 11 need not be the same as or symmetrical to the grading the reservoir adjacent to p-type layers 15.

In the device shown in FIG. 7, reservoir 12 is a series of layers, each with a different indium composition. In reservoir 12 adjacent to n-type layers 11, the composition of indium is increased as each of the layers is grown. The increase or decrease in indium composition need not be the same for each layer in the step-graded reservoir. In the device shown in FIG. 8, reservoirs 12 are fabricated with nonlinear monotonic compositional grading.

The reservoir layer grading schemes illustrated in FIG. 5–8 and described above are graded from a low indium composition in the n-type and p-type layers adjacent to the active region to a high indium composition in the region of the reservoir adjacent to the quantum well layers in the active region. The grading is selected to create a "funnel" which directs carriers into the quantum well layers. In addition, the presence of graded reservoir layers immediately adjacent to the active region increases the amount of material available to hold carriers, which increases the number of carriers available to the quantum well layers.

Figure 9:
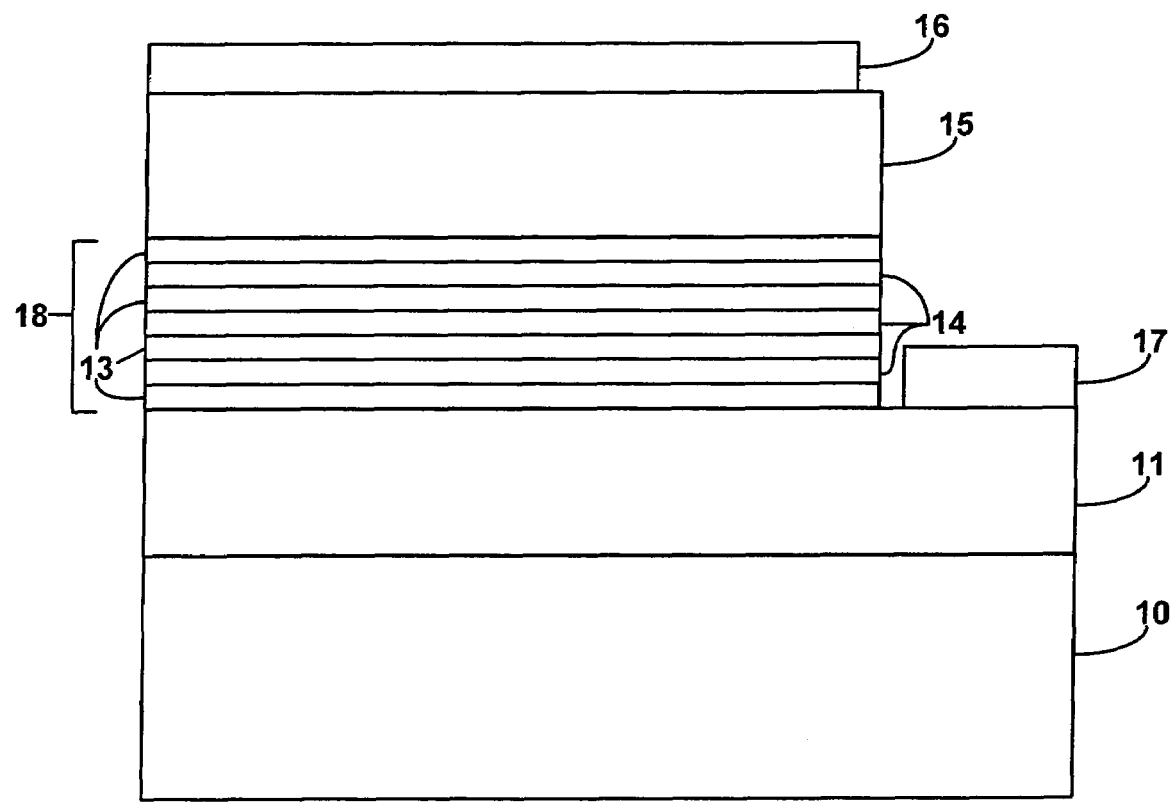
FIG. 9 illustrates a light emitting device according to a third embodiment of the invention.

FIG. 9 illustrates a light emitting device according to a third embodiment of the invention. In the device shown in FIG. 9, the quantum well layers 14 and barrier layers 13 in active region 18 form a super lattice. The quantum well layers and barrier layers may have the same indium composition as the device described above in reference to FIG. 1. In a super lattice, the quantum well layers may have a thickness between about 5 angstroms and about 50 angstroms and often have a thickness between about 20 angstroms and about 40 angstroms. The barrier layers may have a thickness between about 5 angstroms and about 110 angstroms, and often have a thickness less than 25 angstroms. The barriers layers are thin enough that carriers may tunnel between quantum well layers 14 through barrier layers 13 in active region 18. For a given barrier thickness the tunneling rate depends on the width of the quantum well. As the thickness of the quantum well decreases, the tunneling rate increases, because the difference in energy level between the quantum well and the barrier decreases. In some embodiments, the thickness of each quantum well in the active region may be selected according to the desired tunneling rate near that quantum well. The super lattice active region illustrated in FIG. 9 may be used with the reservoir layers illustrated in FIGS. 1–8. For example, the device shown in FIG. 9 may incorporate reservoir layers on one or both sides of the super lattice, and/or may incorporate one or more reservoir layers within the super lattice.

When the barriers are thin enough that carriers can tunnel between quantum well layers as in the device illustrated in FIG. 9, the quantum well layers are "coupled," meaning that active region 18 behaves like a single quantum well layer, rather than several discrete thin quantum well layers. This coupling may offer several advantages. First, since carriers tunnel between quantum well layers, the carriers can be found in any one of the wells, subjecting the carriers to more active material. This is an improvement over a conventional active region with thick barrier layers. As a result, more carriers are available for recombination in the quantum well layers of the active region, which may increase the light output of the device.

Figures 10A, 10B, 10C:
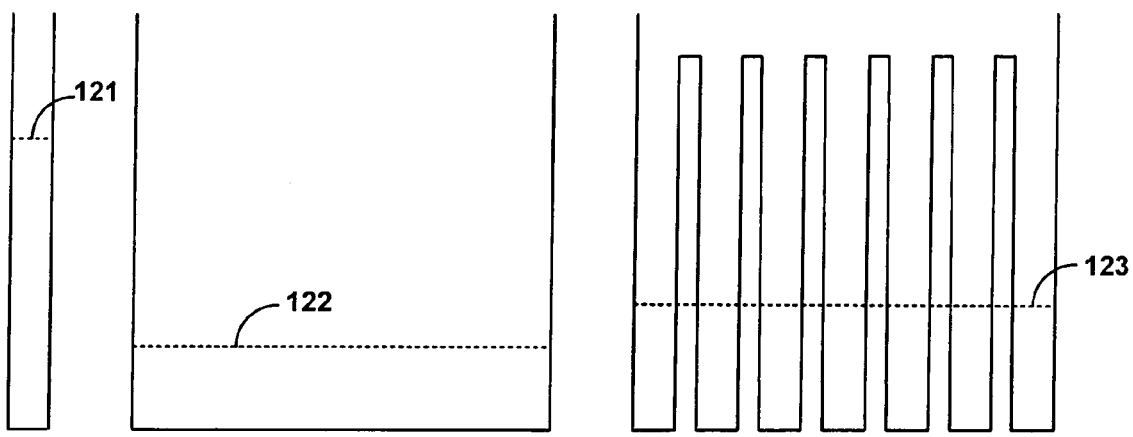
FIGS. 10A–10C illustrate examples of the conduction band edge energy of a thin quantum well layer, a thick quantum well layer, and a superlattice active region.

Second, there may be less confinement penalty in a super lattice active region than in a conventional active region with thick barrier layers. Confinement penalty is illustrated in FIGS. 10A–10C, which show conduction band edge energy diagrams for a thin quantum well (FIG. 10A), a thick quantum well (FIG. 10B), and a super lattice active region (FIG. 10C). Line 121 illustrates an energy level that a carrier must occupy in the quantum well illustrated in FIG. 10A. Since the quantum well of FIG. 10A is thin and the carrier is confined to a small space, energy level 121 is high. In contrast, energy level 122 in the wide quantum well of FIG. 10B is much lower than energy level 121 in FIG. 10A, because the carrier is less confined in the wide quantum well of FIG. 10B. FIG. 10C illustrates an energy level 123 which a carrier must occupy in a super lattice active region. One can think of the super lattice as acting like a wide quantum well with several "posts" in it. Here the carriers "reside" in any one of the wells; and therefore are more spread out compared to a thin quantum well. The presence of the barrier layer "posts" raises the energy of a well with the same active region width. The energy level determines the color of emission from the device. Since the composition of indium in the quantum well layers also affects the color of emission, reducing the energy level by using a superlattice active region may reduce the indium composition required for a given emission color. As described above, as the amount of indium in a layer increases, the crystal quality of the layer typically suffers. Poor crystal quality can cause reduced efficiency. Thus, devices incorporating superlattice active regions may be more efficient, while emitting light of the same color as higher indium composition uncoupled quantum well devices.

Figure 11:
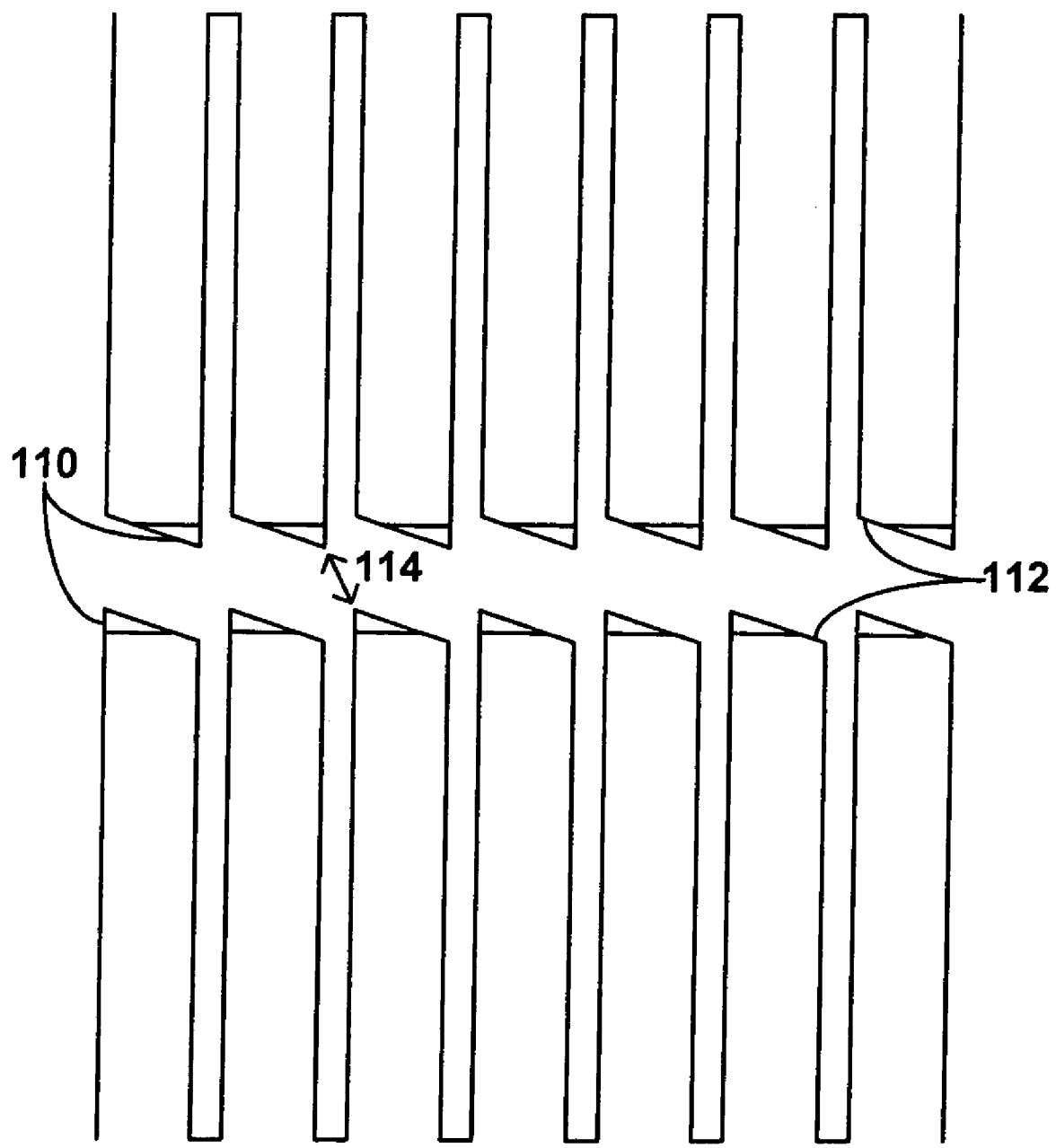
FIG. 11 illustrates an energy band diagram accounting for polarization fields for the superlattice illustrated in FIG. 9.

Third, a superlattice active region may reduce the effects of polarization fields. FIG. 11 illustrates an energy band diagram for a superlattice active region. The thin barrier layers used in a superlattice active region may reduce the effects of polarization fields by permitting spatially indirect recombination, which may increase the amount of light produced by an active region. Due to the polarization field, which "slants" the bottom of each quantum well, carriers will tend to collect in regions 110 of each quantum well layer. Since the barrier layers in a superlattice active region are thin, carriers may be able to recombine across barrier layers, as shown by arrow 114.

Figure 12:
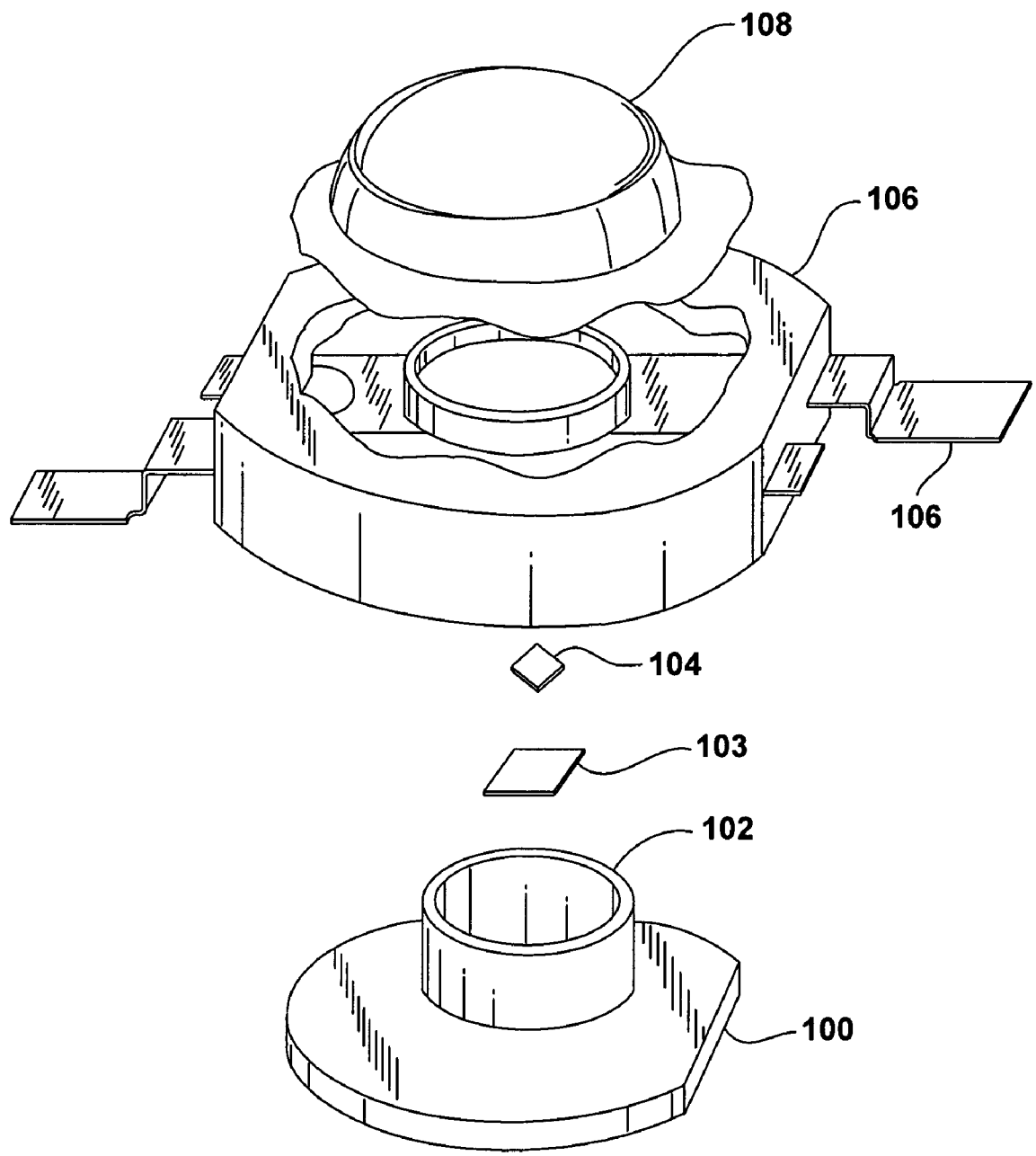
FIG. 12 is an exploded view of a light emitting device including a package.

FIG. 12 is an exploded view of a packaged light emitting device. A heat-sinking slug 100 is placed into an insert-molded leadframe 106. The insert-molded leadframe 106 is, for example, a filled plastic material molded around a metal frame that provides an electrical path. Slug 100 may include an optional reflector cup 102. The light emitting device die 104, which may be any of the devices described above, is mounted directly or indirectly via a thermally conducting submount 103 to slug 100. An optical lens 108 may be added.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A light emitting device comprising:
a region of first conductivity type;
a region of second conductivity type;
an active region disposed between the region of first conductivity type and the region of second conductivity type, the active region comprising:
a plurality of quantum well layers each comprising $Al_xGa_yIn_{1-x-y}N$ ($0 \leq x \leq 1$, $0 \leq y \leq 1$, $0 \leq x+y \leq 1$) and each having a band gap;
a barrier layer having a band gap; and
a reservoir layer disposed between two of the quantum well layers and in direct contact with at least one of the quantum well layers or the barrier layer, the reservoir layer comprising $Al_xGa_yIn_{1-x-y}N$ ($0 \leq x \leq 1$, $0 \leq y \leq 1$, $0 \leq x+y \leq 1$) and having a band gap;
wherein the band gap of each of the quantum well layers is less than the band gap of the reservoir layer, the band gap of each of the quantum well layers is less than the band gap of the barrier layer, the reservoir layer has a thickness greater than a thickness of the barrier layer, the band gap of the barrier layer is greater than the band gap of the reservoir layer, and the reservoir layer provides carriers to the quantum well layers.

2. The light emitting device of claim 1 wherein:
one of the quantum well layers has a first indium composition;
the reservoir layer has a second indium composition; and
the first indium composition is greater than the second indium composition.

3. The light emitting device of claim 2 wherein:
the barrier layer has a third indium composition; and
the second indium composition is greater than the third indium composition.

4. The light emitting device of claim 1 wherein the barrier layer interposes one of the quantum well layers and the reservoir layer.

5. The light emitting device of claim 1 wherein:
one of the quantum well layers has a first thickness;
the reservoir layer has a second thickness; and
the second thickness is greater than the first thickness.

6. The light emitting device of claim 1 wherein:
the barrier layer has a thickness between about 5 angstroms and about 50 angstroms;
one of the quantum well layers has a thickness between about 5 angstroms and about 100 angstroms;
the reservoir layer has a thickness less than or equal to about 250 angstroms.

7. The light emitting device of claim 1 wherein:
the barrier layer is GaN or InGaN with an indium composition between about 0% and about 15%;
one of the quantum well layers is InGaN with an indium composition greater than about 0% and less than about 30%;
the reservoir layer is InGaN with an indium composition between about 0% and about 25%.

8. The light emitting device of claim 1 wherein a composition of at least a portion of the reservoir layer is graded.

9. The light emitting device of claim 8 wherein:
the composition is graded from a first indium composition in a first portion of the reservoir layer adjacent to one of the regions of first conductivity type and second conductivity type to a second composition in a second portion of the reservoir layer adjacent to one of the quantum well layers or the barrier layer; and
the first indium composition is less than the second indium composition.

10. The light emitting device of claim 8 wherein:
the reservoir layer comprises a plurality of sublayers, each sublayer having an indium composition;
a sublayer having the lowest indium composition is located adjacent to one of the regions of first conductivity type and second conductivity type; and
a sublayer having the highest indium composition is located adjacent to one of the quantum well layers or the barrier layer.

11. The light emitting device of claim 8 wherein the grading is monotonic.

12. The light emitting device of claim 8 wherein the composition is graded in a profile selected from the group consisting of linear, step-graded, and parabolic.

13. The light emitting device of claim 1 wherein the reservoir layer comprises a first portion having a constant composition and a second portion having a graded composition.

14. The light emitting device of claim 1 further comprising:
a first contact connected to the region of first conductivity type;
a second contact connected to the region of second conductivity type;
a submount connected to the first and second contacts; and
a lens overlying the active region.

* * * * *